United States Patent [19]
Hoepfner

[11] Patent Number: 6,008,103
[45] Date of Patent: Dec. 28, 1999

[54] METHOD FOR FORMING TRENCH CAPACITORS IN AN INTEGRATED CIRCUIT

[75] Inventor: Joachim Hoepfner, Poughkeepsie, N.Y.

[73] Assignee: Siemens Aktiengesellschaft, Munich, Germany

[21] Appl. No.: 09/031,995

[22] Filed: Feb. 27, 1998

[51] Int. Cl.[6] .................................................. H01L 21/20
[52] U.S. Cl. ......................... 438/386; 438/246; 438/389
[58] Field of Search .................................... 438/389, 386, 438/243, 246, 3, 239, 247, 249, 390, 392

[56] References Cited

U.S. PATENT DOCUMENTS 4,861,729   8/1989   Fuse et al. ............................... 438/246

Primary Examiner—Tuan H. Nguyen
Attorney, Agent, or Firm—Stanton C. Braden

[57] ABSTRACT

A method for forming a trench capacitor in a substrate, including a buried plate of the trench capacitor, is disclosed. The method includes forming a trench within the substrate. The trench has a trench interior surface. The method further includes forming an oxide collar within the trench. The oxide collar covers a first portion of the trench interior surface, leaving a second portion of the trench interior surface uncovered with the oxide collar. There is also included doping the second portion of the trench interior surface with a first dopant using a plasma-enhanced doping process. The plasma-enhanced doping process being configured to cause the first dopant to diffuse into the second portion substantially without depositing an additional layer on the trench interior surface. Additionally, there is included driving the first dopant into the substrate using a high temperature process to form the buried plate.

26 Claims, 6 Drawing Sheets

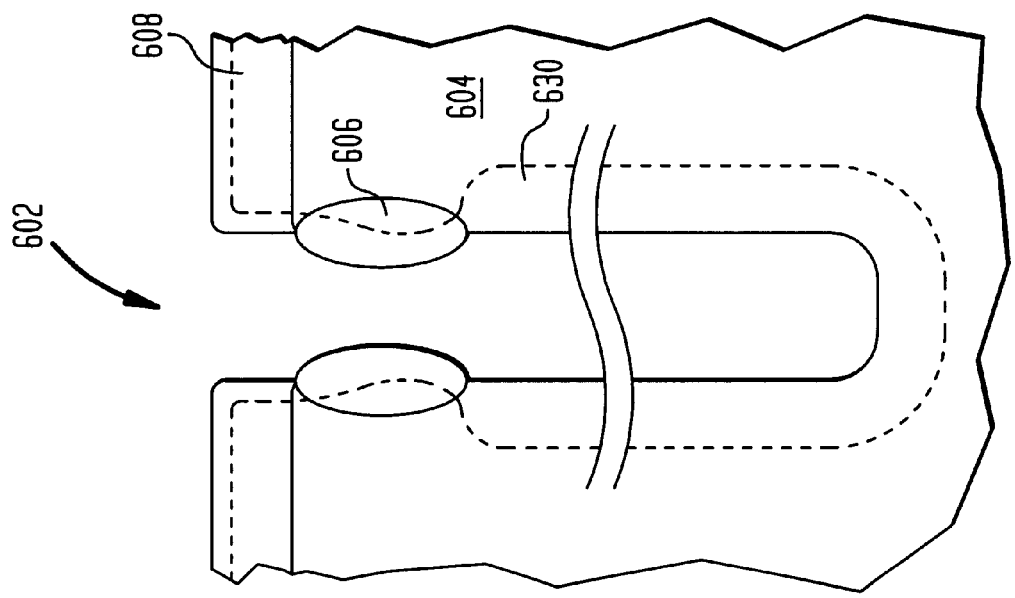
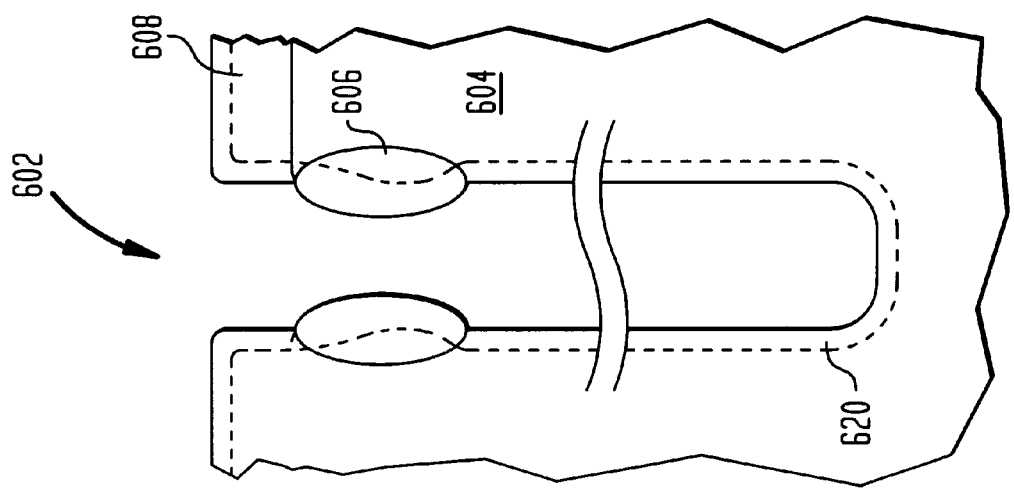

METHOD FOR FORMING TRENCH CAPACITORS IN AN INTEGRATED CIRCUIT

BACKGROUND OF THE INVENTION

The present invention relates to the fabrication of semiconductor-based devices. More particularly, the present invention relates to the fabrication of dynamic random access memory (DRAM) integrated circuits, including the trench capacitors therein.

The use of trench capacitors as storage elements in a DRAM circuit is well known. In typical trench capacitors, buried plates which are conductive regions disposed toward the bottom of the trench capacitors, are often employed to connect adjacent trench capacitors together. In the prior art, the buried plate is often formed by a conventional deposition process of a suitable dopant-containing layer, which coats the interior surface of the trench. The deposition process is then followed by a dopant drive in step in which the dopant from the deposited dopant-containing layer is driven into the substrate, thereby creating the conductive region which acts as the buried plate.

To facilitate discussion, FIG. 1 depicts a substrate 102, representing the substrate out of which a trench capacitor may be formed. In the example of FIG. 1 and the figures herein, substrate 102 is consistently assumed to be a p-substrate for ease of discussion although an n-substrate may also be employed to form trench capacitors, as is well known to those skilled in the art. Within substrate 102, there is formed a trench 104, typically by a suitable etching process such as dry etching of which reactive ion etching (RIE) is one example.

After trench 104 is formed in substrate 102, a dopant-containing layer 106 is blanket deposited over substrate 102 and over the interior surface of trench 104. Dopant-containing layer 106 may represent, for example, an oxide layer doped with an n-type dopant (if substrate 102 is a p-substrate) such as an arsenic-doped or phosphorous-doped glass layer. The arsenic-doped layer may include, for example, a nitride/oxide cap layer to avoid outdiffusion annealing. Conversely, if substrate 102 is an n-substrate, dopant-containing layer 106 may include, for example, p-type dopants such as boron. Dopant-containing layer 106 may be deposited using any suitable deposition process including, for example, chemical vapor deposition (CVD), low pressure chemical vapor deposition (LPCVD) or plasma-enhanced chemical vapor deposition (PECVD).

In FIGS. 2 and 3, a photoresist plug is formed within trench 104 to facilitate etching of a portion of the deposited dopant-containing layer 106. Removal of a portion of the deposited dopant-containing layer 106 is necessary since it is undesirable to have buried plate dopants diffused into the substrate region that is adjacent to the device area (such as the source and/or drain of the DRAM cell's transistor, i.e., the upper region of trench 104). Thus, a photoresist fill step is performed in FIG. 2, which fills trench 104 with a photoresist material (110). In FIG. 3, the photoresist (110) is first etched back to the level shown by reference numeral 112 using a conventional photoresist etch back process. Dopant-containing layer 106 is then etched back to the level of the etched back photoresist (i.e., to about the level indicated by reference numeral 112 in FIG. 3).

In FIG. 4, previously etched back photoresist plug 110A is removed and a cap layer 114 comprising, for example, a three-layer sandwich of oxide/nitride/oxide (ONO) (with one of the oxide layers acting as an adhesion promoting layer between the nitride and the substrate material) or a two-layer nitride/oxide (NO), is deposited into trench 104 and over previously etched back dopant-containing layer 106A. One of the functions of cap layer 114 is to keep the buried plate dopant (e.g., arsenic) from leaving the trench in the subsequently dopant drive in process in which a high temperature step is employed to drive the dopants from dopant-containing layer 106 into the substrate region at the bottom of trench 104.

In FIG. 5, a high temperature dopant drive in process is employed to cause the buried plate dopant material in dopant-containing layer 106 to diffuse into the adjacent substrate region to form the aforementioned conductive region of the buried plate. The dopant drive in process may be accomplished by, for example, exposing the substrate to high temperature for a specified duration (e.g., first for about 1050° C. for about 20 seconds in an Argon or $N_2$ atmosphere). After the dopant has penetrated a suitable distance into the substrate material to form the buried plate (shown in FIG. 5 as buried plate 116), both cap layer 114 and dopant-containing layer 106 are removed in a subsequent etch process (e.g., a wet etch). It should be noted that FIG. 5 only shows a portion of the buried plate and that a buried plate may be connected to a plurality of trench capacitors. Thereafter, additional conventional processing steps are employed to form other components of the trench capacitor (including the oxide collar in region 120) and the associated DRAM cell.

Although the prior art technique for forming the buried plate has in the past accomplished the task of forming a conductive region at the bottom of the trench, there are significant disadvantages. For example, the prior art process requires the actual deposition of a dopant-containing layer (e.g., dopant-containing layer 106 of FIG. 1). For relatively low-density devices, the trenches have a relatively wide trench opening, and this deposition requirement is typically met without much difficulty. As the density of modern integrated circuits increases, however, the trenches become smaller in cross-section and more closely packed together. Concomitantly, the trench opening is significantly smaller, although the trenches may remain deep to provide sufficient storage capacity to act as storage cells (e.g., 40 FF/DT). By way of example, modern high density DRAMs (e.g., 1 gigabit or above) may require that the trenches be as small as 0.15 micron across and up to 6 microns deep.

The narrow and/or high aspect ratio trenches create additional challenges for process engineers, particularly in the formation of robust layers and structures at the bottom of the narrow, high aspect ratio trenches. In particular, the use of narrow trenches render the deposition process that forms the dopant-containing layer (e.g., dopant-containing layer 106 of FIG. 1) unreliable. It has been discovered that when the trench cross-section decreases below a certain size, voids often form in the dopant-containing layer within the trench, particularly near the bottom of the trench where the buried plate is to be formed. An exemplary void 202 in dopant-containing layer 106 is depicted in FIG. 1.

Further, the deposition of the dopant-containing layer often pinches off the trench opening before the interior of the trench is adequately coated with a layer of dopant-containing material, thereby resulting in dopant deficiency by preventing an adequate amount of dopant-containing material to be present within the trench. The voids and/or dopant deficiency adversely affect the electrical performance of the subsequently formed buried plate since the voids may cause unevenness in the dopant concentration within the buried plate, while the dopant deficiency may result in an inadequate dopant concentration within the buried plate, thereby increasing the impedance of the buried plate. By way of example, buried plate 116 of FIG. 5 shows a defect region 130, which is caused by void 202 of FIG. 1. If sufficiently severe, these defects may render the formed DRAM cell defective.

In view of the foregoing, there are desired improved techniques for forming the DRAM trench capacitor, including the buried plate within the trench.

SUMMARY OF THE INVENTION

The invention relates, in one embodiment, to a method for forming a trench capacitor, including a buried plate of the trench capacitor, in a substrate. The method includes forming a trench within the substrate. The trench has a trench interior surface. The method further includes forming an oxide collar within the trench. The oxide collar covers a first portion of the trench interior surface, leaving a second portion of the trench interior surface uncovered with the oxide collar. There is also included doping the second portion of the trench interior surface with a first dopant using a plasma-enhanced doping process. The plasma-enhanced doping process being configured to cause the first dopant to diffuse into the second portion substantially without depositing an additional layer on the trench interior surface. Additionally, there is included driving the first dopant into the substrate using a high temperature process to form the buried plate.

In another embodiment, the invention relates to a method for forming a trench capacitor, including a buried plate of the trench capacitor, in a substrate. The method includes forming a trench within the substrate. The trench has a trench interior surface. There is also included doping at least a first portion of the trench interior surface with a first dopant using a plasma-enhanced doping process. The plasma-enhanced doping process is configured to cause the first dopant to diffuse into the first portion substantially without depositing an additional layer on the trench interior surface. The first dopant represents a dopant employed to form the buried plate.

In yet another embodiment, the invention relates to a method for forming in a substrate a trench capacitor of a dynamic random access memory (DRAM) circuit. The trench capacitor includes a buried plate. The method includes forming a trench within the substrate. The trench has a trench interior surface. There is also included doping at least a first portion of the trench interior surface with a first dopant using a plasma-enhanced doping process. The plasma-enhanced doping process is one of a plasma immersion ion implantation (PIII) process or a plasma doping (PLAD) process. The plasma-enhanced doping process is configured to cause the first dopant to diffuse into the first portion substantially without depositing an additional layer on the trench interior surface. The first dopant represents a dopant employed to form the buried plate.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

To facilitate discussion.

FIG. 8 illustrates, in accordance with one embodiment of the present invention, the trench of FIG. 6 after a plasma-enhanced doping process is performed to introduce the buried plate dopant into the trench.

FIG. 9 illustrates the trench of FIG. 9, including the formed buried plate after the dopant in the dopant-containing layer is diffused into the substrate.

DETAILED DESCRIPTION OF THE PREFERRED EMBODIMENTS

Figure 3:
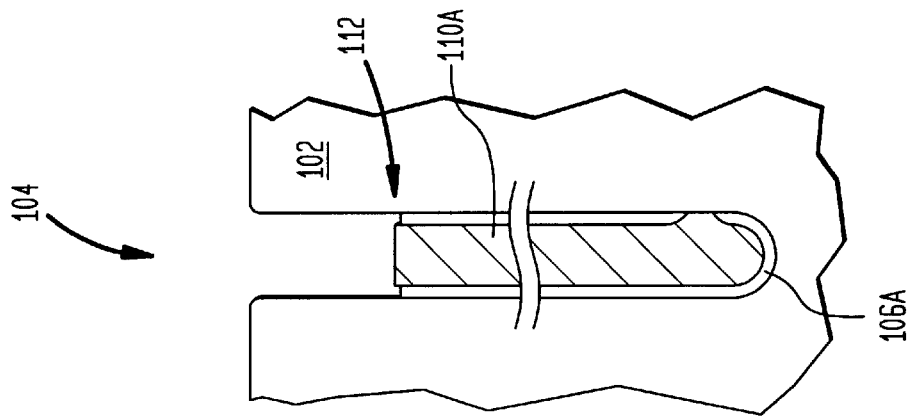
FIG. 3 illustrates the trench of FIG. 2 after the photoresist fill and the dopant-containing layer has been etched back.
Figure 2:
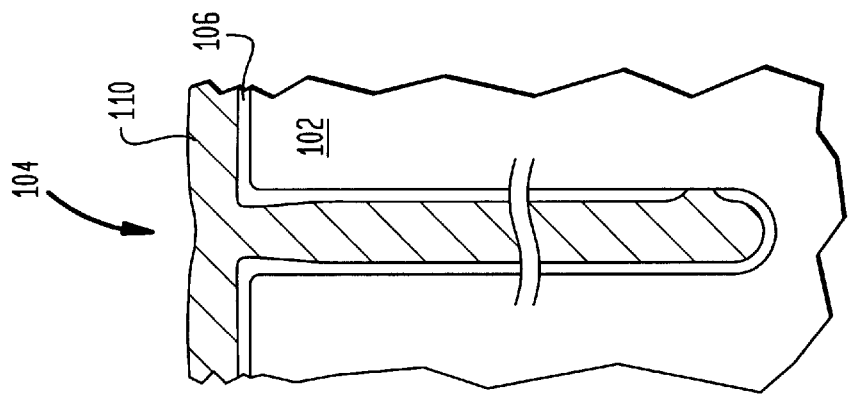
FIG. 2 illustrates the trench of FIG. 1 after a photoresist fill process has been performed.
Figure 1:
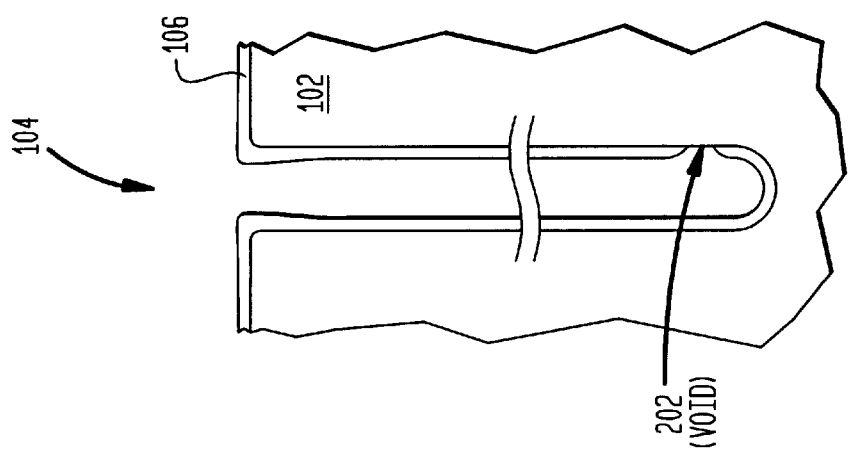
FIG. 1 illustrates a trench in a substrate, including the deposited dopant-containing layer disposed on the trench interior surface.

The present invention will now be described in detail with reference to a few illustrative embodiments thereof as shown in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one embodiment of the present invention, the buried plate dopant that is employed to form the conductive region of the buried plate is directly doped, using a plasma-enhanced doping process, onto the trench interior surface. As the term is employed herein and as will be explained in detail later, plasma-enhanced doping refers to the situation in which the dopant is introduced onto the existing trench interior surface without the substantial deposition of another layer of material thereon. This is in contrast to the prior art deposition approach, in which a layer of arsenic glass fill is typically deposited to facilitate the formation of the buried plate. Since the introduction of the dopant onto the trench interior, in accordance with the plasma-enhanced doping process, does not require the deposition of a layer on the trench interior surface, the aforementioned pinch-off (i.e., bottleneck) and/or void formation problems are advantageously avoided.

In one embodiment, the buried plate dopant is directly doped onto the trench interior surface using a plasma immersion ion implantation (PIII) process. In another embodiment, the dopant is doped onto the trench interior surface using a plasma doping (PLAD) process. Although such plasma-enhanced doping processes may result in some accumulation of the dopant material on the trench interior surface, such accumulation is incidental to the doping process and typically does not form as thick a layer as the prior art deposited dopant-containing layer. If the dopant process is appropriately controlled, most of the dopants diffuse into the trench interior surface during the doping step, preferably with little or any accumulation of dopant material on the trench interior surface itself.

In accordance with one aspect of the present invention, the elimination of the dopant-containing layer deposition step advantageously makes it possible to form a reliable buried plate at the bottom of modern narrow (and/or high aspect ratio) trenches that are typically employed in modern high density integrated circuits. Further, since no dopant-containing layer deposition step is required, the invention makes it possible to form the LOCOS oxide collar (i.e., an oxide collar formed in accordance with the principles of LOCal Oxidation of Silicon) in advance of the buried plate formation step. This is because even if LOCOS causes a bulge of silicon oxide material to be present in the trench during the plasma-enhanced doping step, this LOCOS bulge does not increase the likelihood of a pinch-off since the invention does not require the deposition of another dopant-containing layer into the trench to form the buried plate. As will be discussed in detail later herein, the ability to form the LOCOS oxide collar prior to the buried plate formation step yields many important advantages, including the formation of a higher quality oxide collar and/or the ability to use the oxide collar to perform a self-aligned plasma-enhanced doping and/or dopant drive in step.

Figure 6:
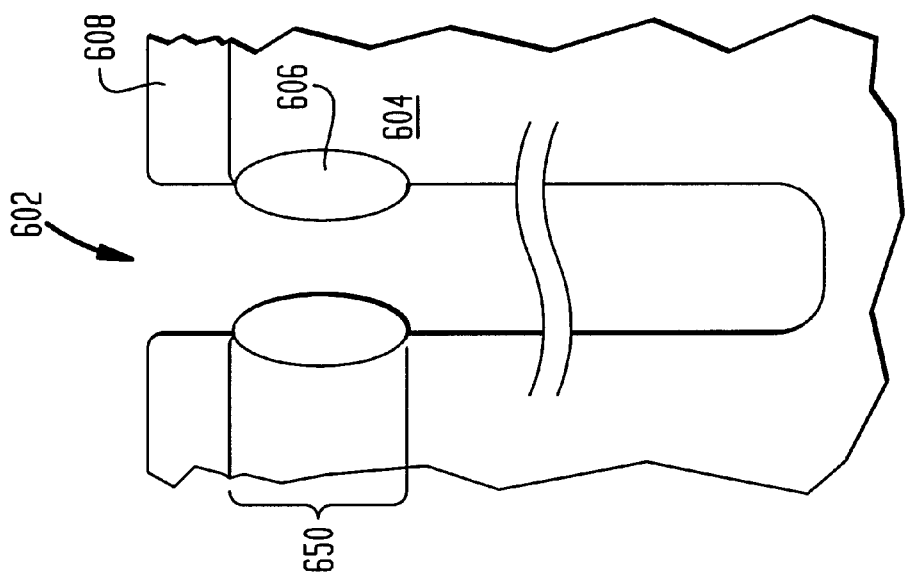
FIG. 6 illustrates, in accordance with one embodiment of the present invention, a trench having therein an oxide collar region prior to plasma-enhanced doping.
Figure 5:
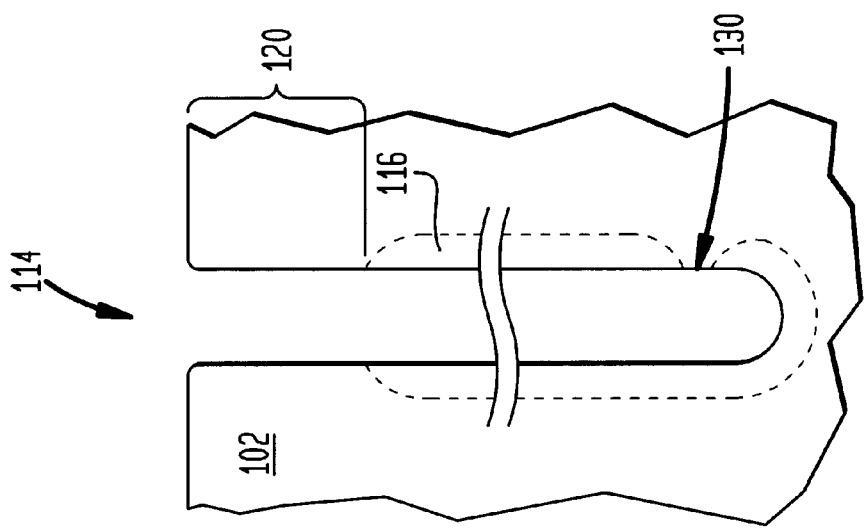
FIG. 5 illustrates the formed buried plate after the dopant in the dopant-containing layer is diffused into the substrate.
Figure 4:
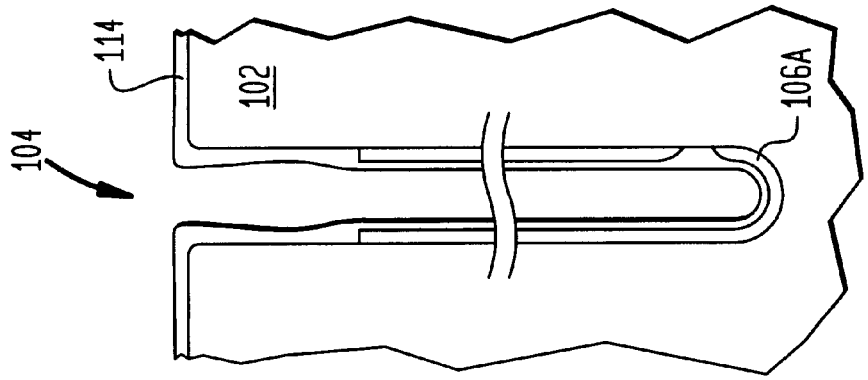
FIG. 4 illustrates the trench of FIG. 3 after a cap layer is conformally deposited.

The features and advantages of the present invention will be explained in greater detail with reference to the figures below. In FIG. 6, there is shown a trench 602 disposed within a substrate 604. As mentioned before, substrate 604 may be either a p-substrate or an n-substrate (the choice of which, as is known, dictates the choice of the buried plate dopant type subsequently employed to formed the buried plate). For ease of discussion, substrate 604 is assumed herein as a p-substrate and the dopant employed to form the buried plate is assumed to be arsenic although, as mentioned, other types of substrate or dopants may well be employed.

There is shown above the upper surface of substrate 604 a nitride layer 608. In one embodiment, nitride layer 608 may represent a layer of $N_xO_y$ and may be, for example, 1300 angstroms thick. Within trench 602, there is disposed an oxide collar 606, representing the oxide collar employed to electrically isolate, for example, the p-well from the n-well of the buried plate or the p-well from the capacitor. In one embodiment, oxide collar 606 is formed by a LOCOS (LOCal Oxidation of Silicon) process although the oxide collar may well be formed by any other suitable oxide formation process. It should be noted that although an oxide collar is shown within trench 602 to illustrate that the inventive buried plate formation process works even when an oxide collar is already formed prior to the formation of the buried plate, the presence of the oxide collar prior to the buried plate formation is not absolutely necessary (i.e., the oxide collar may be formed after the buried plate is formed if desired).

Figure 7C:
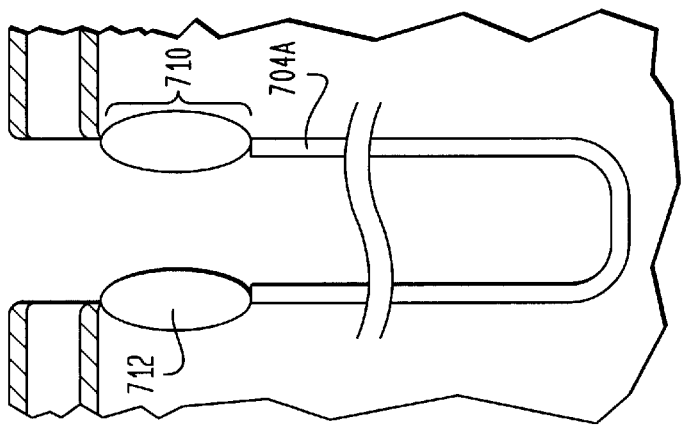
FIGS. 7A–7C illustrate, in accordance with one aspect of the present invention, a local oxidation of silicon (LOCOS) oxide collar formation process.
Figure 7B:
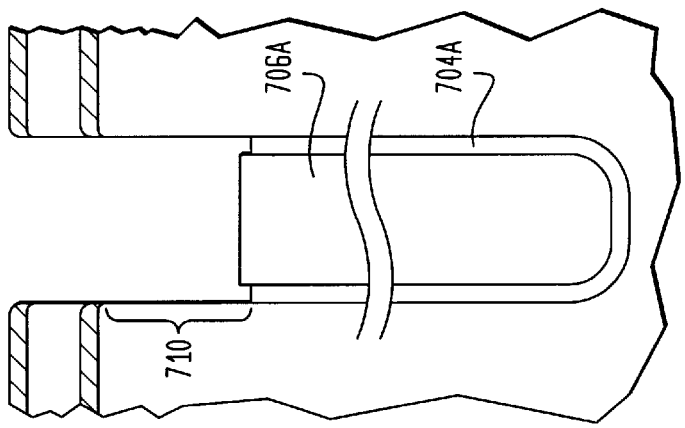
Figure 7A:
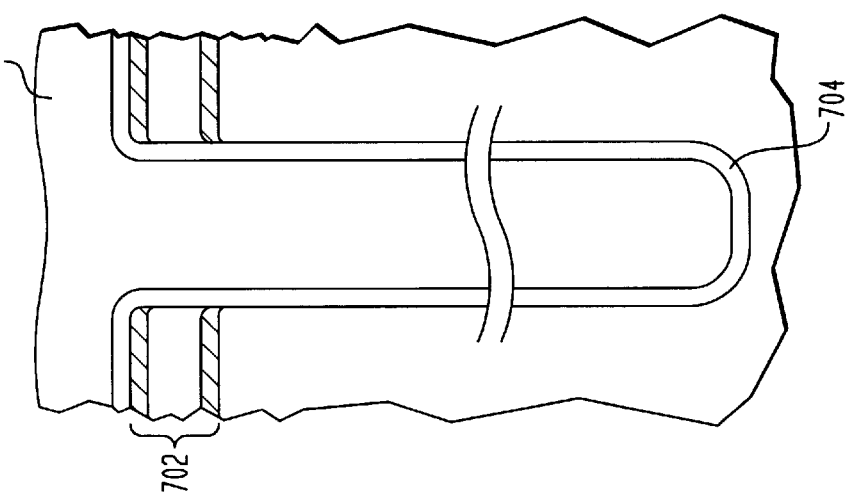

In general, an exemplary LOCOS oxide collar formation process may involve first coating the substrate surface with a hard mask (702 in FIG. 7A). The hard mask may comprise a suitable dielectric layer such as a nitride layer or a three-layer sandwich of oxide/nitride/oxide. After the trench is etched, the trench interior is then coated with a suitable liner layer (e.g., a nitride layer). The liner layer is shown in FIG. 7A as liner layer 704. Thereafter, the liner layer is etched back using a photoresist plug process so that the remaining nitride liner at least covers the region within the trench where the buried plate will eventually be formed.

A suitable photoresist plug process to facilitate the liner etch may involve filling the trench with photoresist (706 in FIG. 7A) and then etching the photoresist back within the trench to about the level of the top of the future buried plate to form a photoresist plug therein (706A in FIG. 7B). Thereafter, a liner etch process is performed to remove the liner material within the trench that is not covered by the photoresist plug. The liner material that is protected by the photoresist plug at the bottom of the trench remains substantially unattacked during the liner etch process. The unetched liner layer is shown in FIG. 7B as liner layer 704A. Thereafter, the photoresist plug itself may be removed, leaving behind a liner coating that covers the portion of the trench interior up to the level of the (now removed) photoresist plug.

The silicon region in the trench where the collar is to be formed (region 710 FIG. 7B) is not covered by the liner material (since the liner material in this region was not covered by the photoresist plug 706A in FIG. 7B and was removed in the earlier liner etch process). Accordingly, the silicon material in region 710 of FIG. 7B is subsequently oxidized in an oxidization step to form the oxide collar (using, for example, either a wet or dry oxidation process). The LOCOS oxide collar is shown in FIG. 7C as oxide collar 712. The absorption of oxygen into the silicon substrate to form silicon oxide causes region 710 to bulge out into the trench interior, thereby reducing somewhat the cross-section of the trench thereat. The thickness of oxide collar 712 is configured to prevent the subsequently deposited buried plate dopant from penetrating through to the substrate region adjacent the oxide collar. By way of example, an oxide collar thickness of about 100–350 angstroms is suitable in one case where dopant penetration is found to be about 50 to 150 angstroms. After the oxide collar is formed, the liner material at the bottom of the trench may be removed using a suitable etch process (e.g., a wet etch process such as dipping in a buffered HF solution if nitride is employed as the liner material).

In FIG. 8, a suitable buried plate dopant (such as arsenic for the p-substrate) is directly doped into trench 602 of FIG. 6. In one advantageous embodiment, plasma-enhanced doping of the buried plate dopant is accomplished in a plasma deposition chamber using a plasma immersion ion implantation (PIII) process. Plasma immersion ion implantation is a well known process. However, the use of PIII to perform deep trench doping of the trench capacitor offers many advantages due to the fact that the isotropic and anisotropic components of the dope can be readily optimized to achieve the desired doping uniformity along the vertical and horizontal surfaces of the trench interior.

Of course there exist many configurations for PIII systems, some of which are described in, for example, "Plasma Immersion Ion Implantation Of Semiconductors" by Cheung et al. *Material Research Society Symposium Processing* Vol. 279 (1993), U.S. Pat. No. 5,607,509 "High Impedance Plasma Ion Implantation Apparatus," U.S. Pat. No. 5,354,381 "Plasma Immersion Ion Implantation ($PI^3$) Apparatus,", U.S. Pat. No. 5,449,920 "Large Area Ion Implantation Process And Apparatus," and U.S. Pat. No. 5,558,718 "Pulsed Source Ion Implantation Apparatus And Method," all of which are incorporated herein by reference.

In one exemplary PIII system, a high density plasma, which is ionized out of a source gas containing the dopant (e.g., $AsH_3$ in the case of the arsenic dopant) is employed to dope the substrate. In some cases, the high density plasma is disposed proximate to a magnet field and kept continuously on. Ionization may be accomplished when energy is supplied to a suitable discharge source, e.g., a Penning discharge source. As the term is used herein, high density plasma generally refers to plasma having an ion density in the range of about $1E^{14}$ to $1E^{17}/cm^3$. Suppliers of suitable diode-based plasma immersion ion implantation system include, for example, Eaton Corp. of Gloucester, MA and Varian Associates Inc. of Palo Alto, Calif.

The substrate is disposed into the PIII chamber and a continuously pulsed or DC negative voltage may be applied to the substrate, causing the sheath to expand and more ions to be extracted from the plasma and accelerate toward the substrate to cause additional implantation (i.e., the anisotropic component). To increase doping along the vertical sidewall, the chamber pressure may be increased and/or the substrate may be brought closer to the plasma. In a preferred embodiment, the doping is achieved in a diode-type PIII system although any type of PIII system, including electron cyclotron resonance (ECR) systems, capacitively coupled systems, inductively coupled systems, and the like, may well be employed as long as they are configured to dope the vertical and horizontal surfaces of the trench interior without forming a significant deposited layer. If a diode system is employed, a hollow anode discharge grid (which may be grounded) may be disposed between the high voltage electrode and the substrate to improve doping uniformity across the substrate surface.

In general, doping in the PIII chamber has both an anisotropic component (i.e., the doping is unidirectional toward the bottom of the trench) and an isotropic component (i.e., the doping is omnidirectional). Varying doping process parameters (such as chamber pressure, distance between the plates and/or between the plate and the substrate and/or other suitable parameters) tends to influence the balance between the two components. These process parameters may be set by the process engineer to optimize the plasma-enhanced doping process to achieve the desired doping effect on the vertical and horizontal surfaces of the trench.

By way of example, the anisotropic component (which controls ion implantation at the bottom of the trench) tends to be improved when the chamber pressure is increased. Conversely, the isotropic component (which controls doping along the trench sidewall) tends to be improved when the chamber pressure is increased. As another example, when the distance between the plates in a diode system is increased, the anisotropic component of the doping process tends to be increased. Conversely, when the distance between the plates in a diode system is decreased, the anisotropic component of the doping process tends to be decreased.

In general, little if any actual deposition accumulates on the surface of the silicon as a result of plasma-enhanced doping. In one example, it is observed that about 1–3 atomic layers of the dopant material may be present on the silicon surface after doping in a PIII chamber. However, this is substantially thinner than the thickness of the dopant-containing layer deposited by the prior art process.

Alternatively, plasma-enhanced doping of the buried plate dopant may be accomplished using a plasma doping (PLAD) system. Plasma doping (PLAD) is a well known process. In one example, plasma doping is accomplished when a dedicated HV pulse power supply ignites the plasma to simultaneously perform the isotropic and anisotropic (i.e., implantation) doping. Of course many PLAD system configurations exist, some of which are discussed in, for example, "Plasma Doping for Silicon" by Mizuno et. al. *Surface and Coatings Technology* (Elsevier Science S.A. 1996), U.S. Pat. No. 4,912,065 "Plasma Doping Method," U.S. Pat. No. 4,937,205 "Plasma Doping Process and Apparatus Therefor," all of which are incorporated herein by reference. Suppliers of suitable PLAD systems include, for example, Applied Materials Inc. of Santa Clara, Calif. and Lam Research Corp. of Fremont, Calif.

In one exemplary PLAD system, the substrate to be doped is introduced into the chamber and plasma is thereafter ignited from a buried plate dopant source gas (such as one that includes $AsH_3$) using a high voltage pulsed power (such as an RF power supply). Simultaneously, the ions are extracted to facilitate implantation. Again, the anisotropic and isotropic components of the doping process may be influenced by various parameter settings. The exact settings of course depend on the anisotropic/isotropic balance desired to achieve the desired doping effect within the trench (including the vertical trench sidewall and the trench bottom), the size of the chamber, the size of the substrate, the composition of the substrate layers, the specific configuration of the plasma system and/or other factors. However, such a setting exercise is within the skills of one skilled in the art given this disclosure.

The diffusion depth of the buried plate dopant after the plasma-enhanced doping step is shown by dashed line 620 in FIG. 8. Note that although some of the buried plate dopant is introduced onto the surface of nitride layer 608, the presence of this dopant thereon is not detrimental since nitride layer 608 is typically removed later on. The implantation dosage is configured such that a sufficient amount of dopant penetrates sufficiently into substrate 604 during the subsequent dopant drive in step to form the desired buried plate. Of course different DRAM circuits may have different requirements as to the electrical characteristics of the buried plate, and accordingly the exact dimension and/or dopant concentration within the buried plate may vary.

In FIG. 9, the dopant doped in FIG. 8 has been driven into the substrate using a dopant drive in process. In one example, the dopant drive in process may be performed by exposing the substrate to high temperature (e.g., first for about 1050° C. for about 20 seconds in an Argon or $N_2$ atmosphere). The dopant drive in process causes the dopant doped earlier via the plasma-enhanced doping process to diffuse further into the substrate to form the conductive region of the buried plate (shown in FIG. 9 as buried plate 630).

As mentioned earlier, the invention advantageously employs a plasma enhanced doping process (e.g., the aforementioned PIII or PLAD process or a similarly suitable process) to minimize additional deposition when introducing the buried plate dopant into the trench. This is in sharp contrast with the prior art approach in which a layer of dopant-containing material is actually deposited inside the trench. Because of this, the current doping process is less sensitive to the reduced cross-section of the trenches in modern high density ICs, and can be employed on trenches which may be too narrow for reliable deposition (of a dopant-containing layer).

Further, since the plasma-enhanced doping process of the present invention is less sensitive to the size of the trench opening, it is possible to form in advance oxide collar 606 (using, e.g., a LOCOS process) prior to forming the buried plate. In the prior art, the advanced formation of the oxide collar and the concomitant reduction in the trench opening (by the LOCOS oxide material) often cause the trench opening to be pinched off by the subsequently deposited dopant-containing material. Since substantially no additional deposition occurs in accordance with the present invention, the risk of pinching off the trench opening is substantially eliminated when the buried plate dopant is introduced into the trench.

Further, the existing oxide collar 606 (and nitride layer 608) may also function as a "mask" to allow the plasma-enhanced doping process and the dopant drive in process to be essentially self-aligned. That is, oxide collar 606 prevents the dopant from being introduced and/or diffused into its adjacent substrate region within the trench. As a result, the doping is self-aligned with reference to the buried plate. Furthermore, the presence of the LOCOS oxide collar causes the capacitor, as well as the buried plate, to be isolated with reference to the well of the transistor. As can be seen in FIG. 6, nitride layer 608 advantageously prevents the dopant from being introduced and/or diffused into the substrate from above.

In one embodiment, the dopant drive in step is performed in an arsenic atmosphere (e.g., in the case if the arsenic glass layer is not capped). In another embodiment, the dopant drive in step may be performed in, for example, a nitrogen and 10% oxygen atmosphere. The dopant material may be capped, after plasma-enhanced doping, by a suitable capping layer prior to the dopant drive in step. The capping material may be a suitable dielectric material such as, for example, $SiO_2$, nitride, or the aforementioned three-layer sandwich of oxide/nitride/oxide (ONO) or a two-layer sandwich of nitride/oxide (NO). Capping encapsulates the dopant material to keep the dopant inside the trench and/or to prevent the chamber from being contaminated with the dopant material during subsequent processes. The capping material may be removed afterward by an appropriate etching process (e.g., wet etch).

After the buried plate is formed, the remainder of the DRAM cell, including components within the trench capacitor, may be completed using conventional DRAM processing techniques. The resulting DRAM may then be employed in a variety of commercial and consumer electronics devices, including computers.

Figure 10A:
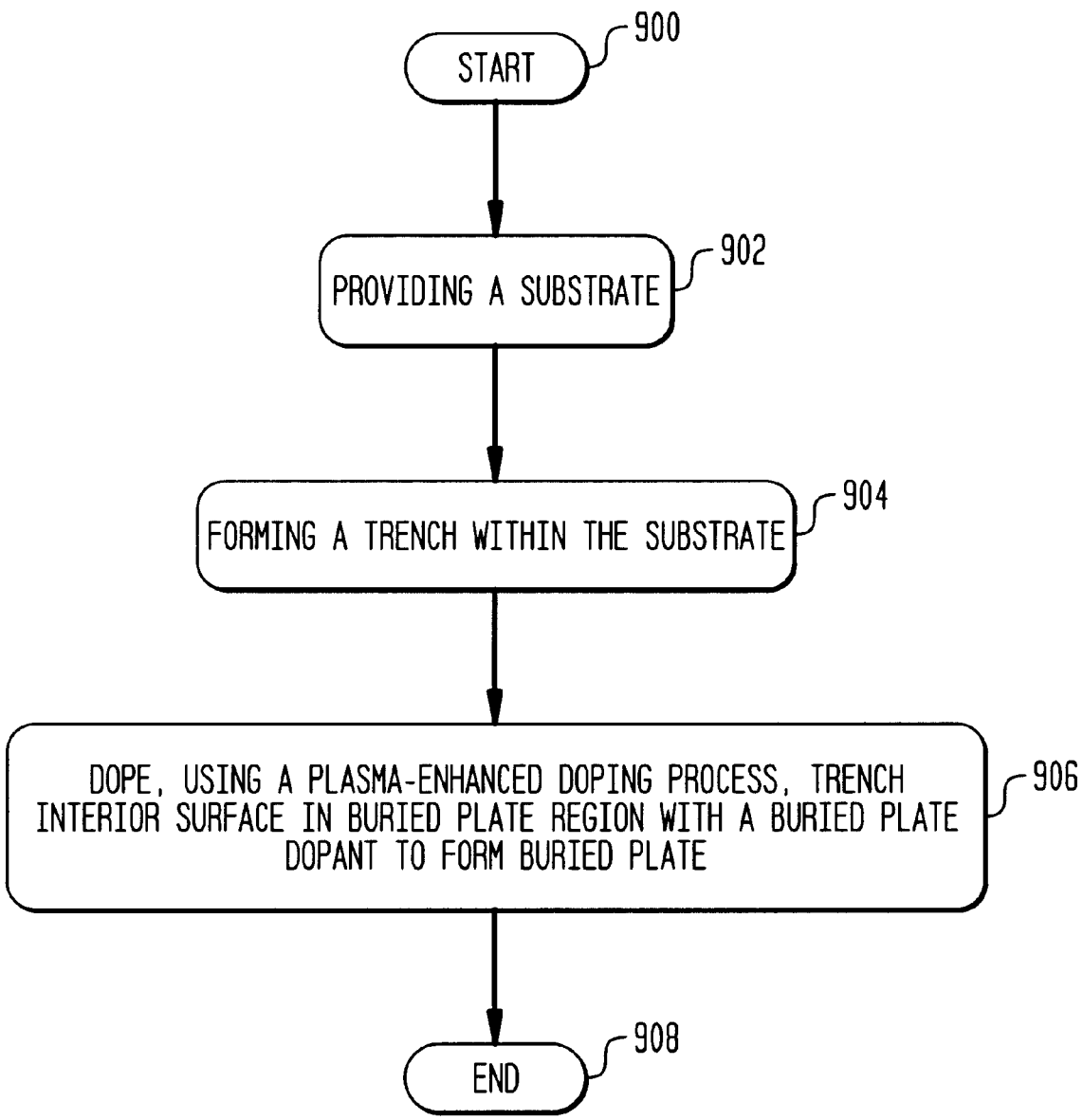
FIG. 10A illustrates, in accordance with one embodiment of the present invention, some of the relevant steps employed to form the buried plate in the trench capacitor.

FIG. 10A illustrates, in accordance with one embodiment of the present invention, the relevant steps for forming the relevant part of the DRAM cell, including the buried plate. In step 902, a substrate (such as a silicon wafer) suitable for forming the trench capacitors is provided. In step 904, a trench is etched in the substrate using any suitable etch process, including the aforementioned dry etch (e.g., RIE etch).

In step 906, a plasma-enhanced doping process is employed to dope the trench interior surface with a buried plate dopant (e.g., arsenic in one example). Note that although the plasma-enhanced doping process tends to dope the entire trench surface, regions of the trench where dopants are not desired are preferably protected using a suitable protective mask. When a LOCOS oxide collar is provided, the LOCOS oxide collar advantageously functions as the protective feature that prevents the buried plate dopant from diffusing into the substrate region adjacent the LOCOS oxide collar (e.g., region 650 in FIG. 6). Thereafter, additional conventional processing steps may be employed to complete the fabrication of the DRAM cell.

Figure 10B:
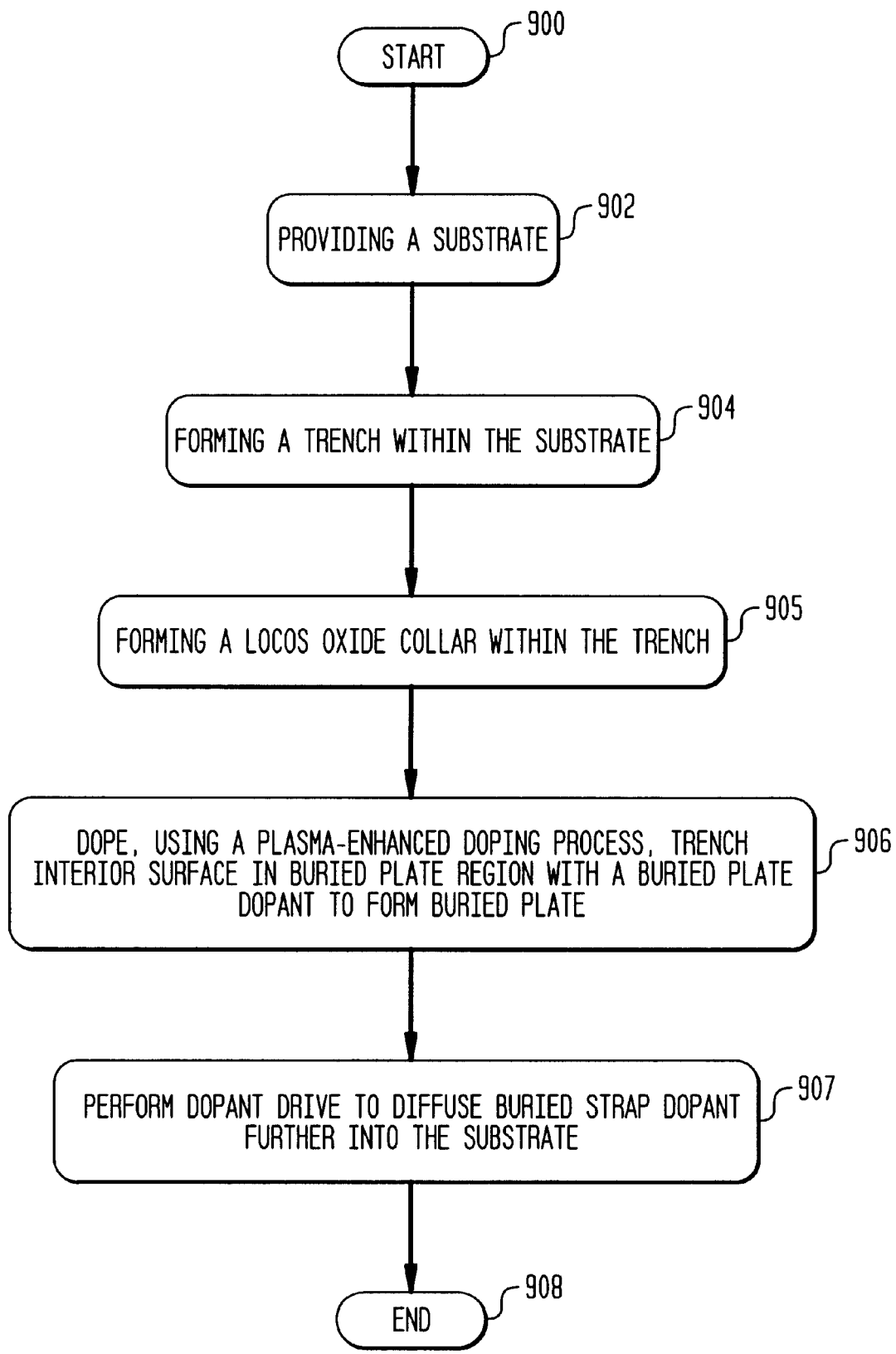
FIG. 10B illustrates, in accordance with another embodiment of the present invention, some of the relevant steps employed to form the buried plate in the trench capacitor.

FIG. 10B illustrates, in accordance with another embodiment of the present invention, the relevant steps for forming the relevant part of the DRAM cell, including the buried plate. In FIG. 10B, step 902, 904, and 906 are substantially the same as those performed in connection with FIG. 8. The process in FIG. 10B however also includes the formation of a LOCOS oxide collar (step 905) prior to the plasma-enhanced doping step 906. This LOCOS oxide collar will be present during the plasma-enhanced doping step 906 and in a subsequent dopant drive in step (step 907) during which the dopant is driven further into the substrate. During these two steps, the LOCOS oxide collar advantageously acts, as mentioned, as a "mask" to allow the plasma-enhanced dopant process and the dopant drive in process to be essentially self-aligned. To function in that role, the LOCOS collar is preferably sufficiently thick to prevent dopants from penetrating all the way through the LOCOS oxide collar during the plasma-enhanced doping and/or dopant drive in process. In this step 907, the dopant may be driven into the substrate to form the buried plate using, as mentioned, a high temperature process. Thereafter, additional conventional processing steps may be employed to complete the fabrication of the DRAM cell.

EXAMPLE 1

PLASMA IMMERSION ION IMPLANTATION (PIII)

In one example, an 8-inch wafer having thereon a hard mask ($SiO_2$/Nitride) is disposed in a Eaton PIII system. $AsH_3$ or $PH_3$ plasma is generated by an inductively-coupled plasma source (in the MHz range). However, it is contemplated that any Si technology dopant suitable for forming the buried plate may well be employed.

The pressure within the chamber is about 5 mTorr. However, it is contemplated that the pressure may range from about 1 mTorr to about 500 mTorr, and more preferably from about 1 mTorr to about 20 mTorr in this or another PIII system. The doping energy is about 1 keV. However, it is contemplated that the doping energy may range from about 0.1 keV to about 30 keV, and more preferably from about 0.1 keV to about 10 keV in this or another PIII system.

Depending on the chamber size and design, sufficient buried plate dopant source gas is flowed to keep the pressure at the above-discussed range. Suitable carrier gases such as $H_2$ or He may be employed to reduce the ion flux density if desired (e.g., about 10% to about 50% of the dopant source gas flow).

The typical dosage is about $1E^{19}$ ions/cm$^3$. However, it is contemplated that the dosage may range from about $5E^{18}$ ions/cm$^3$ to about $5E^{19}$ ions/cm$^3$, and more preferably from about $8E^{18}$ ions/cm$^3$ to about $2E^{19}$ ions/cm$^3$ in some cases. The typical doping time is about 60 seconds. However, it is contemplated that the doping time may range from about 10 seconds to about 10 minutes, and more preferably from about 50 seconds to about 70 seconds in this or another PIII system. The pulse rate is about 10 kHz. However, it is contemplated that the pulse rate may range from about 500 Hz to about 30 kHz, and more preferably from about 1 kHz to about 5 kHz in some cases. The magnetic field is about 40 Gauss in one example.

EXAMPLE 2

PLASMA DOPING (PLAD)

In one example, an 8-inch wafer having thereon a hard mask ($SiO_2$/Nitride) or photoresist is disposed in a Varian PLAD system (Gloucester, Mass.). For reason of availability and convenience, $BF_3$ is employed as the test dopant source gas. However, it is contemplated that any Si technology dopant suitable for forming the buried plate (e.g., arsenic, phosphorous, or the like) may well be employed.

The pressure within the chamber is about <10 mTorr. However, it is contemplated that the pressure may range from about <1 mTorr to about 500 mTorr, and more preferably from about <1 mTorr to about 10 mTorr in this or another PLAD system. The doping energy is about 1 keV. However, it is contemplated that the doping energy may range from about 0.1 keV to about 10 keV, and more preferably from about 0.5 keV to about 5 keV in this or another PLAD system.

Depending on the chamber size and design, sufficient buried plate dopant source gas is flowed to keep the pressure at the above-discussed range. Suitable carrier gases such as $H_2$ or He may be employed to reduce the ion flux density if desired (e.g., about 10% to about 50% of the dopant source gas flow).

The typical dosage is about $1E^{19}$ ions/cm$^3$. However, it is contemplated that the dosage may range from about $5E^{18}$ ions/cm$^3$ to about $5E^{19}$ ions/cm$^3$, and more preferably from about $8E^{18}$ ions/cm$^3$ to about $2E^{19}$ ions/cm$^3$ in some cases. The typical doping time is about 100 seconds. However, it is contemplated that the doping time may range from about 10 seconds to about 10 minutes, and more preferably from about 80 seconds to about 120 seconds in this or another PLAD system. The duty factor (i.e., the time plasma is on the wafer for a given pulse rate) is about 1/20 to the full pulse rate. In one example, the duty factor is about 20% with the pulsing frequency below 10 kHz.

As can be appreciated from the foregoing, the invention advantageously facilitates the formation of a DRAM trench capacitor, including the buried plate, even in narrow trenches (e.g., those having a cross-section of 0.25 microns or below) and even if a LOCOS oxide collar is formed prior to the buried plate formation process (bottle neck shape). Since the prior art dopant-containing layer deposition step has been eliminated, the invention advantageously eliminates the disadvantages associated therewith, e.g., the possibility inherent in prior art techniques of forming of voids in the dopant-containing layer within the trench and/or of dopant deficiency as the trench opening is pinched off. It has also been found that the plasma-enhanced doping process makes it possible, with appropriate optimization, to have uniform doping on the trench interior surface, right down to the bottom of the trench. Since it is difficult to accurately control the deposition in narrow trenches, particularly at the bottom of the trenches, the invention is a significant advance over prior art deposition-oriented approach. It is contemplated that the invention is particularly suitable for use in the fabrication of trench capacitors in modern high density IC's, even in trenches which are bottle-shaped (i.e., having a trench opening narrower than the trench cross-section within the substrate).

Further, since a LOCOS oxide collar may be formed in advance, the invention advantageously employs this LOCOS oxide collar as a "mask" during the plasma-enhanced doping and dopant drive in processes, thereby making these processes essentially self-aligning. As can be appreciated by those skilled in the art, the steps saved by the inventive DRAM trench capacitor formation technique shortens, in a nontrivial manner, the time and complexity required to fabricate the DRAM cell.

Additionally, since the LOCOS oxide collar can now be formed early on, the trench interior surface upon which the LOCOS oxide collar is formed is still relatively smooth when the LOCOS oxide collar is formed. As such, a higher quality LOCOS oxide collar may be formed, which aids in retarding the penetration of the dopant material into adjacent substrate regions. The thickness of the oxide collar may be made thinner by rendering the oxide collar more resistant to dopant penetration. To facilitate a thinner oxide collar (or to not require the oxide collar at all prior to buried plate dopant doping), a nitride doping process may be employed to introduce nitride into the oxide collar region (either before or after LOCOS). Alternatively or additionally, the oxide collar region may be counter-doped (i.e., doped in advance with a dopant configured to neutralize the subsequently introduced buried plate dopant). In one example, a suitable p-dopant such as Indium or Boron (e.g., $BF_2$) may be employed as the counterdopant before LOCOS. Suitable n-type counterdopants include, for example, Arsenic, Antimony, or Phosphorous.

While this invention has been described in terms of several illustrative embodiments, there are alterations, permutations, and equivalents which fall within the scope of this invention. By way of example, although arsenic dopant is discussed herein to facilitate ease of understanding, any type of dopant used in silicon technology and suitable for forming the buried plate may be employed. It is therefore intended that the following appended claims be interpreted as including all such alterations, permutations, and equivalents as fall within the true spirit and scope of the present invention.

What is claimed is:

1. A method fabricating a semiconductor device, the method comprising:
   forming a trench within a semiconductor body, said trench having a trench interior surface;
   forming an oxide collar within said trench, said oxide collar covering a first portion of said trench interior surface, leaving a second portion of said trench interior surface uncovered with said oxide collar;
   thereafter, doping said second portion of said trench interior surface with a first dopant using a plasma-enhanced doping process, said plasma-enhanced doping process being configured to cause said first dopant to diffuse into said second portion substantially without depositing an additional layer on said trench interior surface; and
   driving said first dopant into said semiconductor body using a high temperature process.

2. The method of claim 1 wherein said forming said oxide collar is accomplished using a local oxidation of silicon (LOCOS) process.

3. The method of claim 1 wherein said semiconductor body represents a p-type substrate, said first dopant represents an n-type dopant.

4. The method of claim 3 wherein said first dopant represents arsenic dopant.

5. The method of claim 1 wherein said semiconductor body represents an n-type substrate, said first dopant represents a p-type dopant.

6. The method of claim 1 wherein said plasma doping process comprises a plasma immersion ion implantation (PIII) process.

7. The method of claim 1 wherein said plasma doping process comprises a plasma doping (PLAD) process.

8. The method of claim 1 further comprising:
   forming a cap layer above said first dopant prior to said driving, said cap layer being configured to prevent said first dopant from contaminating a chamber employed during said driving.

9. The method of claim 1 wherein said trench represents a bottle-shaped trench, said bottle-shaped trench having a trench opening smaller than a cross-section of an interior region of said bottle-shaped trench.

10. The method of claim 9 wherein said bottle-shaped trench is employed in the fabrication of a dynamic random access memory (DRAM) circuit.

11. The method of claim 1 wherein the trench is formed as a trench for a trench capacitor, the trench capacitor including a buried plate.

12. The method of claim 1 wherein the trench is formed as a trench for a trench capacitor, the trench capacitor including a buried plate, said first dopant representing a dopant employed to form said buried plate.

13. A method of fabricating a semiconductor device, said method comprising:

forming a trench within a semiconductor body, said trench having a trench interior surface;

forming an oxide collar within said trench, said oxide collar covering a first portion of said trench interior surface such that a second portion of said trench interior surface is exposed: and doping said second portion of said trench interior surface with a first dopant using a plasma-enhanced doping process said oxide collar preventing said first dopant from doping said first portion of said trench interior surface.

14. The method of claim 13 wherein said plasma-enhanced doping process is one of a plasma immersion ion implantation (PIII) process and a plasma doping (PLAD) process.

15. The method of claim 13 wherein said oxide collar is employed as a mask to protect a substrate region adjacent said oxide collar from dopant penetration of said first dopant during said doping.

16. The process of claim 1 wherein said forming said oxide collar is accomplished using a local oxidation of silicon (LOCOS) process.

17. The process of claim 13 wherein said semiconductor body represents a p-type substrate, said first dopant represents an n-type dopant.

18. The process of claim 17 wherein said first dopant represents arsenic dopant.

19. The process of claim 13 wherein said semiconductor body represents an n-type substrate, said first dopant represents a p-type dopant.

20. The process of claim 13 further comprising:

forming a cap layer above said first dopant prior to said driving, said cap layer being configured to prevent said first dopant from contaminating a chamber employed during said driving.

21. The method of claim 13 wherein said trench represents a bottle-shaped trench, said bottle-shaped trench having a trench opening smaller than a cross-section of an interior region of said bottle-shaped trench.

22. The method of claim 13 wherein said trench capacitor is employed in the fabrication of a dynamic random access memory (DRAM) circuit.

23. The method of claim 13 wherein said plasma-enhanced doping process is configured to cause said first dopant to diffuse into said second portion substantially without depositing an additional layer on said trench interior surface.

24. A method for forming in a substrate a trench capacitor of a dynamic random access memory (DRAM) circuit, said trench capacitor including a buried plate, said method comprising:

forming a trench within said substrate, said trench having a trench interior surface;

forming an oxide collar within said trench, said oxide collar covering a second portion of said trench interior surface, leaving said first portion of said trench interior surface uncovered with said oxide collar; and doping at least said first portion of said trench interior surface with a first dopant using a plasma-enhanced doping process, said plasma-enhanced doping process is one of a plasma immersion ion implantation (PIII) process and a plasma doping (PLAD) process, said plasma-enhanced doping process being configured to cause said first dopant to diffuse into said first portion substantially without depositing an additional layer on said trench interior surface, said first dopant representing a dopant employed to form said buried plate.

25. The method of claim 24 wherein said oxide collar is formed within said trench using a local oxidation of silicon (LOCOS) process prior to said doping.

26. The method of claim 24 further comprising employing said oxide collar as a mask to protect a substrate region adjacent said oxide collar from dopant penetration of said first dopant during said doping.

* * * * *